(12) United States Patent
Agarwal et al.

(10) Patent No.: US 7,795,958 B2
(45) Date of Patent: Sep. 14, 2010

(54) MINIMIZING CHANGES IN COMMON MODE VOLTAGE AT INPUTS OF AN OPERATIONAL AMPLIFIER USED IN A SWITCHED CAPACITOR DIFFERENTIAL AMPLIFIER

(75) Inventors: Nitin Agarwal, Bangalore (IN); Saurabh Singh, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 104 days.

(21) Appl. No.: 12/177,170

(22) Filed: Jul. 22, 2008

(65) Prior Publication Data

US 2010/0019841 A1 Jan. 28, 2010

(51) Int. Cl.
*H03F 1/02* (2006.01)
(52) U.S. Cl. ......................................................... 330/9
(58) Field of Classification Search ...................... 330/9; 327/96, 124
See application file for complete search history.

(56) References Cited

U.S. PATENT DOCUMENTS 7,449,923 B2 * 11/2008 Braswell et al. ............... 327/96

* cited by examiner

*Primary Examiner*—Steven J Mottola
(74) *Attorney, Agent, or Firm*—John J. Patti; Wade J. Brady, III; Frederick J. Telecky, Jr.

(57) ABSTRACT

A reference generation circuit provided according to an aspect of the present invention generates a reference potential at different levels in the hold phase of different cycles in an input path of a switched capacitor differential amplifier. In an embodiment, for each hold phase, the reference generator provides the reference potential with a magnitude that tracks the magnitude of the input signal applied in a corresponding (preceding) sample phase. In case of a single-ended output, the reference potential generated for each hold phase equals the magnitude of one of the inputs on the differential input path. As a result, the common mode voltage at the input terminals of an operational amplifier contained in the switched capacitor differential amplifier is maintained at a desired level.

8 Claims, 3 Drawing Sheets

MINIMIZING CHANGES IN COMMON MODE VOLTAGE AT INPUTS OF AN OPERATIONAL AMPLIFIER USED IN A SWITCHED CAPACITOR DIFFERENTIAL AMPLIFIER

BACKGROUND

1. Field of the Invention

The present invention relates generally to amplifiers, and more specifically to minimizing changes in common mode voltage at inputs of an operational amplifier used in a switched capacitor differential amplifier.

2. Related Art

Differential amplifiers are often employed to amplify (enhance the signal level/strength of) signals. As is well-known, a differential amplifier ideally amplifies the difference between the voltages at its two input terminals, while attenuating/rejecting a voltage common at both the input terminals.

A switched capacitor differential amplifier is a type of a differential amplifier in which charge is switched (transferred) among capacitors connected to various input/output terminals/nodes of an operational amplifier to obtain a desired gain/amplification. Components such as switches are generally employed to obtain the transferring of the charge, as is well-known in the relevant arts.

The operation of an operational amplifier is characterized by a common mode voltage at its input terminals (which may also be viewed as 'virtual ground' terminals). As is well-known, common mode voltage generally refers to the voltage level with respect to a reference potential (e.g., ground terminal) that is common (same) at each of the input terminals, and is generally measured as the average of the voltages at the two input terminals.

It is generally desirable to minimize changes in common mode voltage at the input terminals of an operational amplifier. Such minimization can lead to benefits such as reduced distortions in the output signal, etc., as is also well-known in the relevant arts.

SUMMARY

A reference generation circuit provided according to an aspect of the present invention generates a reference potential at different levels in the hold phase of different cycles in an input path of a switched capacitor differential amplifier. The levels may be provided depending on the requirements of the specific environments.

In an embodiment, for each hold phase, the reference generator provides the reference potential with a magnitude that tracks the magnitude of the input signal. In case of a single-ended output, the reference potential generated for each hold phase equals the magnitude of one of the inputs on the differential input path. As a result, the common mode voltage at the input terminals of an operational amplifier contained in the switched capacitor differential amplifier is maintained at a desired level. In case of a differential output, the reference potential generated for each hold phase equals the average of the inputs on the differential input path.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the features of the invention.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION OF EXAMPLE EMBODIMENTS

Various features of the present invention will be clear in comparison with a prior approach. Accordingly, the description of such a prior approach is provided first.

1. Prior Switched Capacitor Differential Amplifier

Figure 1:
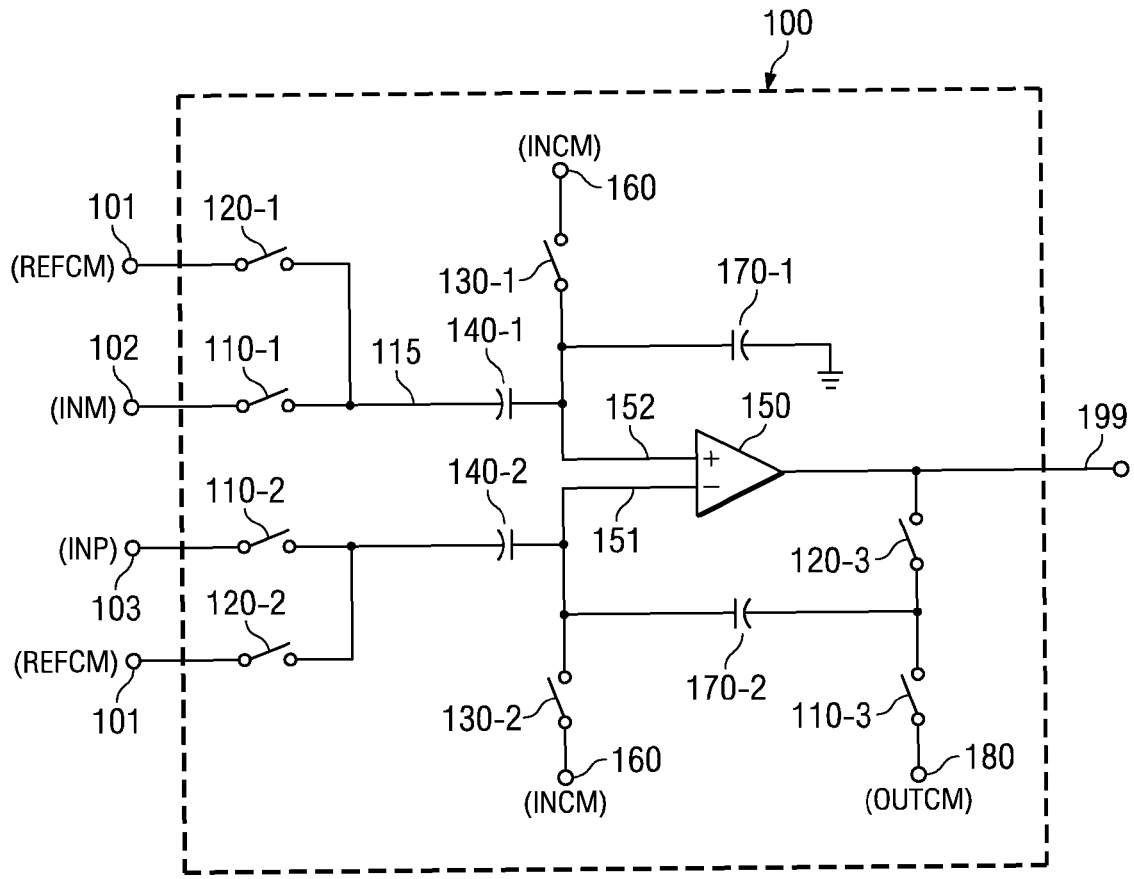
FIG. 1 is a circuit diagram illustrating the details of a prior switched capacitor differential amplifier in a prior embodiment.

FIG. 1 is a circuit diagram illustrating the details of a prior switched capacitor differential amplifier. Switched capacitor differential amplifier 100 is shown containing operational amplifier 150, sampling capacitors 140-1 and 140-2, feedback capacitor 170-2, capacitor 170-1, switches 110-1, 110-2, 110-3, 120-1, 120-2, 120-3, 130-1 and 130-2.

It should be understood that only representative number/type of components are included in FIG. 1 for illustration. Alternative embodiments can be implemented with more/fewer number/type of components, without departing from several aspects of the present invention as will be apparent to one skilled in the relevant arts by reading the disclosure provided herein.

INM 102 and INP 103 together represent an input signal in differential form, and the corresponding amplified output signal in single ended form is shown provided on path 199 Though the example embodiment of FIG. 1 is shown with a single ended output, several features of the present invention can be implemented in the case of differential output signals also. Further, although the input signal is noted as being differential in the example, single-ended inputs (referenced to a constant reference potential, such as ground) may also be provided on path 102 and/or path 103.

Operational amplifier 150 amplifies an input signal received across the inverting and non-inverting terminals (virtual ground terminals/nodes 151 and 152 respectively), and provides the corresponding output on path 199. Capacitors 140-1, 140-2, 170-1, and 170-2, in conjunction with operational amplifier 150, are operable to amplify the input signal received on INM 102 and INP 103 by appropriate operation of switches 110-1, 110-2, 110-3, 120-1, 120-2, 120-3, 130-1 and 130-2 as described briefly with respect to FIG. 2.

Figure 2:
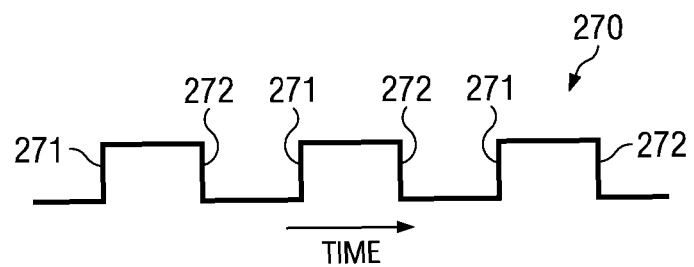
FIG. 2 is a timing diagram depicting the sample and hold phases in each cycle of operation of a switched capacitor differential amplifier.

FIG. 2 is a timing diagram illustrating the sample and hold phases in an embodiment. As may be appreciated, each cycle contains a sample phase between time instances 272 and 271, and then a hold phase between time instances 271 and 272. The cycles repeat successively, as shown.

In a sample phase, switches 110-1, 110-2, 110-3, 130-1, and 130-2 are closed to sample the input signal on to capacitor 140-1 and 140-2. Switches 120-1, 120-2, and 120-3 may be open during the sample phase. Closure of switches 130-1 and 130-2 causes a desired (predetermined) common mode voltage INCM (160) to be provided/applied at the input terminals (inverting and non-inverting, denoted by '−' and '+' signs respectively with respect to operation amplifier 150 in FIG. 1) during sample phases.

In a hold phase, switches 120-1, 120-2 and 120-3 are closed to cause amplification of difference between voltages INP (103) and INM (102), by transfer/movement of charges between capacitors 140-1 and 170-1, and capacitors 140-2 and 170-2, with capacitor 170-2 being connected as a feedback capacitor between output (199) and inverting terminal 151 of operational amplifier 150. Switches 110-1, 110-2, 110-3, 130-1 and 130-2 are open during the sample phase.

OUTCM 180 represents a constant potential, which is used to maintain the common mode voltage of output path 199 at a desired level. The amplified output voltage 199 is expressible by the following equation:

$$\text{OUT} = \text{OUTCM} + (G*(\text{INP} - \text{INM})) \quad \text{Equation 1}$$

wherein,

OUT is the output voltage, and

G is a gain factor determined by the ratio of capacitors 170-2 and 140-2, and is equal to (capacitance of capacitor 140-2 divided by capacitance of capacitor 170-2).

As described in the background section above, it is desirable to keep the common voltage on the inverting and non-inverting terminals at a substantially constant potential (ideally equaling the potential of INCM 160).

However, there are often situations when the application (or presence) of an input signal on input paths 102 and 103 of switched capacitor differential amplifier 100 would cause corresponding changes to the common mode voltage at the input terminals (inverting and non-inverting or virtual ground terminals) of operational amplifier 150.

In particular, such a change in the common mode voltage at the input terminals of operational amplifier 150 may be caused if the magnitude of input 102 (or in general, an input which is not in the feedback loop (output 199-closed switch 120-3-capacitor 170-2-input terminal 151 of OPAMP 150)) changes from one sample phase to a next sample phase, with potential REFCM (101) (connected to capacitors 140-1 and 140-2 in hold phases) remaining constant.

To briefly illustrate with an example, assuming voltage INM 102 (applied during a sample phase) differs from voltage REFCM 101 (applied during hold phases), charge stored in the sample phase on capacitor 140-1 changes, causing a change (from INCM 160) in the voltage at the non-inverting terminal 152 (+) of operational amplifier 150. Since operational amplifier 150 may have a sufficiently large gain, the voltage change at the non-inverting terminal may cause a corresponding voltage change at the inverting terminal 151 (−).

Thus, the common mode voltage at the inputs terminals of operational amplifier 150 may change from the desired value INCM 160, and input INM 102 may be viewed as representing the input common mode of the input signal (on input paths 102 and 103). As noted above, such a situation may lead to distortions of the output signal on path 199 due to changes (movements) of the virtual ground terminals of OPAMP 150 from a desired bias point, degradation of the common mode rejection ratio (CMRR) of differential switched capacitor amplifier 100, etc.

Several aspects of the present invention minimize the changes in the common mode voltage at the input terminal of an operational amplifier in a switched capacitor differential amplifier, as described below with examples.

2. Novel Switched Capacitor Differential Amplifier

Figure 3:
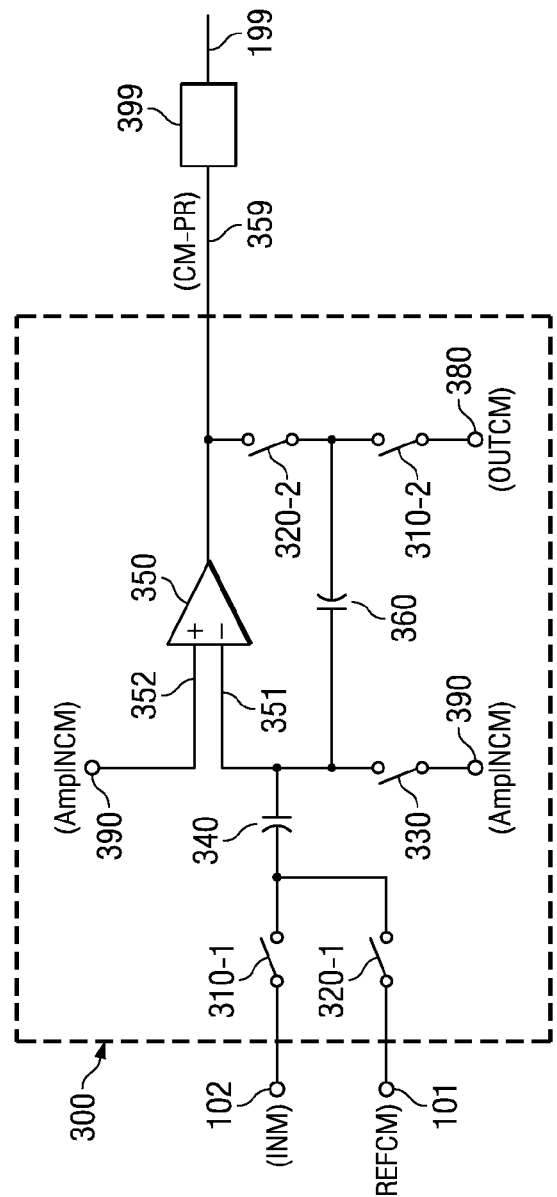
FIG. 3 is a block diagram illustrating the details of a switched capacitor differential amplifier in an embodiment of the present invention.

FIG. 3 is a block diagram illustrating a switched capacitor differential amplifier according to an aspect of the present invention. Merely for illustration the features there are described with respect to the components of FIG. 1. However, it should be appreciated that at least some of the features can be implemented in other environments/components, without departing from scope and spirit of several aspects of the present invention.

The switched capacitor differential amplifier of FIG. 3 is shown containing reference generator 300 providing the reference potential to block 399. According to an aspect of the present invention, reference generator 300 provides CM-PR on path 359 with different levels (voltages) in the hold phase of different cycles. The specific levels can depend on the different requirements of the block 399 when together operating as a switched capacitor differential amplifier. The implementation of various combinations of reference generator 300 and block 399, together to operate as a switched capacitor differential amplifier, will be apparent to one skilled in the relevant arts by reading the disclosure provided herein.

In an embodiment, block 399 contains all the elements of FIG. 1, and thus signal CM-PR on path 359 is provided as REFCM 101 of FIG. 1. In such an embodiment, the changes in the common mode at the input terminals of operational amplifier 150 can be minimized by ensuring that there is a positive correlation between the magnitude of INM (in the sample phase) and CM-PR (in the hold phase of the same cycle). That is, when INM (102) moves higher, CM-PR (359) also needs to be generated with a higher value.

In one implementation shown in FIG. 3 in detail, CM-PR (359) is generated to equal the magnitude of INM (102). Reference generator 300 there is shown containing operational amplifier 350, capacitors 340 and 360, switches 310-1, 310-2, 320-1, 320-2 and 330. The operation of each component is described below with further reference to the timing diagrams of FIGS. 2 and 4 in further detail.

In a sample phase, switches 310-1, 310-2 and 330 are closed. Switches 320-1 and 320-2 are kept open during the sample phase. Voltage AmpINCM (390) is applied at the inverting terminal (351) of operational amplifier 350. Capacitor 340 samples INM (102), and stores a charge proportional to INM (102), with the charge expressed by the following equation:

$$Q340 = (\text{INM} - \text{AmpINCM})*C340 \quad \text{Equation 2}$$

Wherein,

Q340 is the charged stored on capacitor 340, and

C340 is the capacitance of capacitor 340.

Capacitor 360 stores a charge proportional to voltage OUTCM (380), with the charge expressed by the following equation:

$$Q360 = (\text{OUTCM} - \text{AmpINCM})*C360 \quad \text{Equation 3}$$

Wherein,

Q360 is the charged stored on capacitor 360, and

C360 is the capacitance of capacitor 360.

During the hold phase, switches 320-1 and 320-2 are closed and switches 310-1, 310-2 and 330 are open. Since the voltage at the inverting terminal (351) of operational amplifier 350 should equal the voltage AmpINCM (390) at non-inverting terminal (352) due to the feedback action, the following relationship is obtained:

$$INM + OUTCM = REFCM + CM\text{-}PR \qquad \text{Equation (4)}$$

Since OUTCM (380) and REFCM (101) are fixed/constant voltages, any change in INM is reflected as a change in CM-PR, as may be observed from equation 4 above. In other words, CM-PR follows the changes in INM.

In an embodiment, OUTCM is chosen to equal REFCM and accordingly, CM-PR equals INM. The corresponding operation is illustrated in further detail in the timing diagram of FIG. 4. The timing diagram is shown containing signals clock (determining the sample (S) and hold (H) phases, as depicted in FIG. 2 as well), INM (102), CM-PR (359), INP (103) and node 115 (of FIG. 1).

Figure 4:
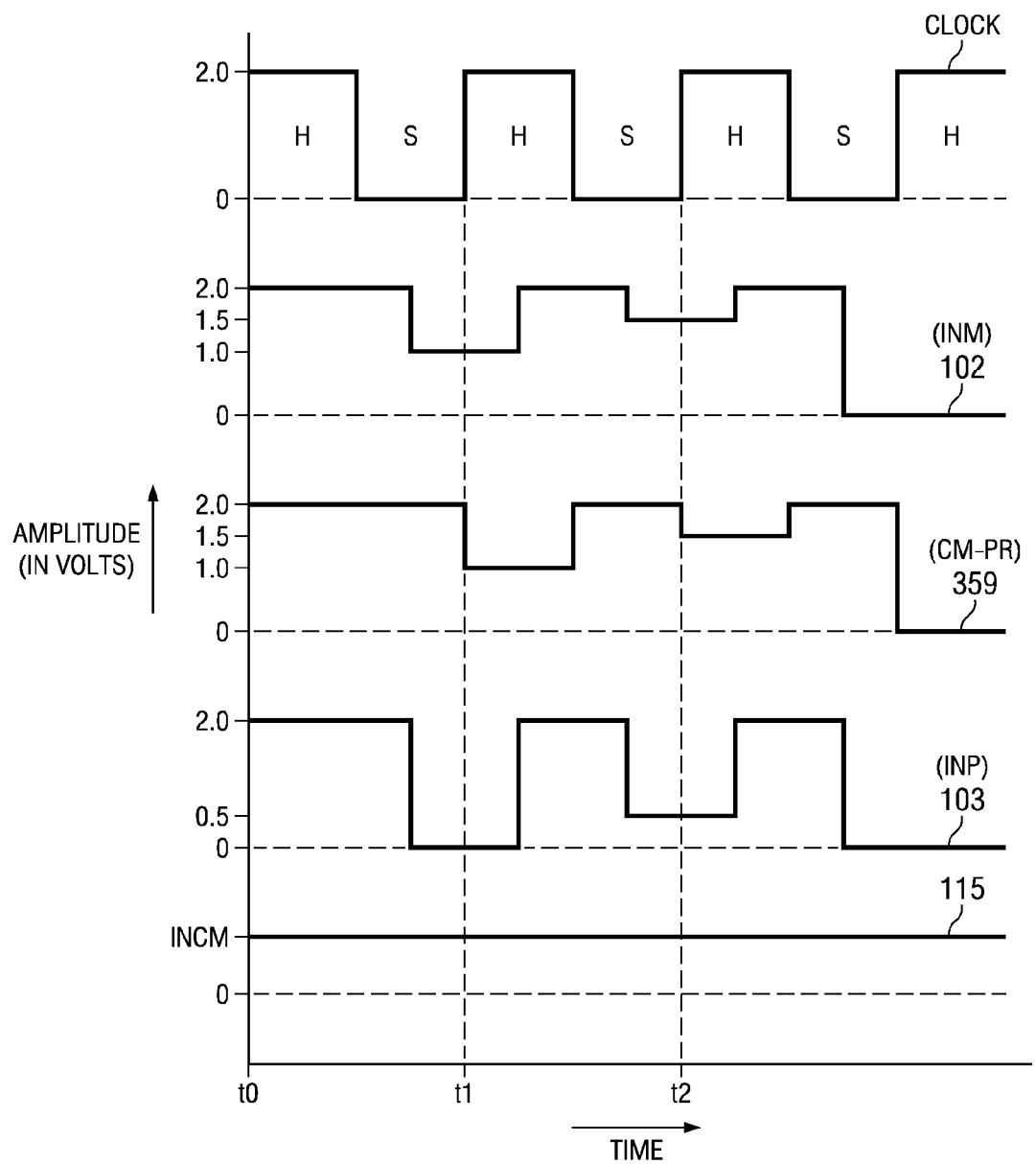
FIG. 4 is a timing diagram illustrating the inter-relationship of various signals in a switched capacitor differential amplifier, in an embodiment of the present invention.

With respect to FIG. 4, the common mode voltage of input signal (INM/INP) is shown as changing with respect to time. Specifically, the common mode voltage of input signal (INM/INP) at time instances t1 and t2 (marking the end of corresponding sampling intervals/phases) may be seen as being different. At t1, the common mode voltage is 0.5V, while at t2 the common mode voltage is IV.

However, signal CM-PR at time instances t1 and t2 (determining the start of the corresponding hold phases) equals INM, i.e. magnitude of signal CM-PR provided during a hold phase is made equal to the magnitude of INM at the end of the corresponding (preceding) sample phase. As a result, the voltage connected to node 115 (FIG. 1) may be viewed as being constant. Consequently, the common mode voltage at the virtual ground terminals (nodes 152 and 151 of FIG. 1) of operational amplifier 150 is also maintained constant (equal to the desired value INCM) despite common mode changes in input INM (102). Thus, common mode voltage changes/movements at the virtual ground terminals (151/152) of operational amplifier 150 are minimized (zero in the ideal case, described in FIG. 4).

While several features above are described with respect to single ended output merely for illustration, it should be appreciated that the features can be extended to differential output signal as well, as will be apparent to one skilled in the relevant arts by reading the disclosure herein. Some of the changes in comparison to FIGS. 1 and 3, for such differential output, are noted briefly below.

For example, the feedback portion (170-2, 120-3, 110-3, 180) is replicated in place of capacitor 170-1 of FIG. 1. Operational amplifier 150 will have differential outputs OUTP and OUTM instead of a single output 199. Reference generator 300 may need to receive both INM and INP, and generate CM-PR with a magnitude equal to (INM+INP)/2 (which may be viewed as the common mode voltage of differential input INM/INP in such a case).

It should be further appreciated that the switched capacitor differential amplifiers thus provided can be used in various environments. For example, such amplifiers can be employed in, but not limited to, correlated double sampling amplifiers, radio receivers and transmitters, Analog to Digital Converters (ADCs), etc. An example environment in which correlated double sampling is used is described next.

3. Example Device

Figure 5:
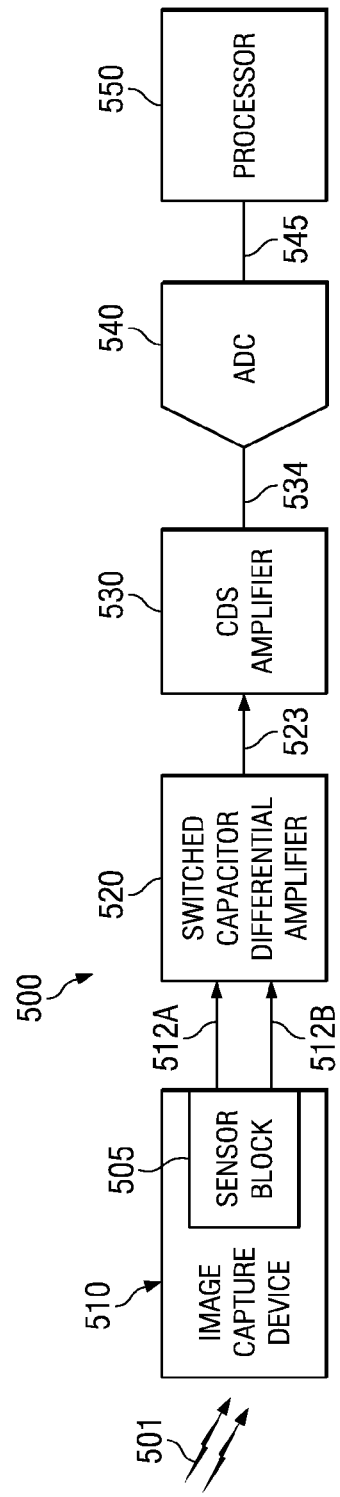
FIG. 5 is a block diagram of an example device in which several aspects of the present invention are implemented.

FIG. 5 is a block diagram of an example environment in which several aspects of the present invention can be implemented. Image processing system 500 is shown containing image capture device 510, sensor block 505, switched capacitor differential amplifier 520, CDS (correlated double sampling) amplifier 530, analog to digital converter (ADC) 540 and processor 550. The environment and the components of FIG. 5 are shown merely by way of illustration, and various aspects of the present invention can be implemented in other environments and using other components as well.

Image capture device 510 generates an image of a scene (represented by arrows 501), and is shown containing sensor block 505. Image of scene 501 may be projected by a lens (not shown, but contained in image capture device 510) onto sensor block 505 which may be a charge-coupled device (CCD), containing corresponding circuitry causing sensor block 505 to generate a differential voltage output (paths 512A and 512B) proportional to the light intensity impinging on it. Circuitry within image capture device 510 (or sensor block 505) provides differential output voltages corresponding to different image points (pixels) at corresponding time instances across paths 512A/512B.

Switched capacitor differential amplifier 520 operates to amplify the differential input received across paths 512A/512B, and may be designed to have zero or minimal common mode voltage changes at virtual ground terminals of a corresponding operational amplifier contained within it, as described above with respect to FIG. 3. As noted with respect to equation 1, the output 523 of switched capacitor differential amplifier 520 may contain a constant component (OUTCM of equation 1) as well as an information-bearing component (G*(INP−INM) of equation 1). With combined reference to FIGS. 3 and 5, paths 512A and 512B of FIG. 5 correspond to paths 102 and 103, while path 523 of FIG. 5 corresponds to path 199.

CDS amplifier 530 operates to remove the constant (or offset) component OUTCM, and provides only the information-bearing component (G*(INP−INM) on path 534.

ADC 540 converts the input received on path 534 to corresponding digital codes, and forwards the codes on path 545 to processor 550. Processor 550 may process the digital codes received on path 545 to perform various image processing operations.

Though the terminals (in FIGS. 1 and 3) are shown with direct connections to various other terminals, it should be appreciated that additional components (as suited for the specific environment) may also be present in the path, and accordingly the connections may be viewed as being electrically coupled to the same connected terminals. Further, some of the signals (e.g., REFCM 101 and CM-PR 359) may be generated internal to the switched capacitor differential amplifier, though they are shown as being received from an external source.

Further, when implemented in other environments, switched capacitor differential amplifier 520 may receive the input signals from other types of interface components, as suited for the specific environment.

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. An apparatus comprising:
   a switched capacitor amplifier circuit that samples an input signal during a sample phase, that receives a first reference voltage during a hold phase, that receives a first input common mode voltage during the sample phase voltage, and that receive an output common mode voltage during the sample phase; and
   a reference signal generator having:
      a reference amplifier having a first input terminal, a second input terminal, and an output terminal, wherein the first input terminal of the reference amplifier receives a second input common mode voltage, and wherein the output terminal of the reference amplifier is coupled to the switched capacitor reference amplifier circuit so as to provide the first reference voltage to the switched capacitor reference amplifier circuit during the hold phase; and
      a switched capacitor network having a plurality of switches and a plurality of capacitors, wherein the switched capacitor network is coupled to the second input terminal of the reference amplifier and the output terminal of the reference amplifier, wherein at least one of the capacitors receives at least a portion of the input signal during the sample phase and a second reference voltage during the hold phase, and wherein at least one of the capacitors receives the output common mode voltage during the sample phase and the second input common mode voltage during the sample phase.

2. The apparatus of claim 1, wherein the switched capacitor network further comprises:
   a first switch that receives at least a portion of the input signal, wherein the first switch is closed during a sample phase;
   a second switch that receives the second reference voltage, wherein the second switch is closed during a hold phase;
   a first capacitor that is coupled to the first switch, the second switch, and the second input terminal of the reference amplifier;
   a third switch that is coupled to the second input terminal of the second capacitor and that receives the second input common mode voltage, wherein the third switch is closed during the sample phase;
   a second capacitor that is coupled to the second input terminal of the reference amplifier;
   a fourth switch that receives the output common mode voltage and that is coupled to the reference amplifier, wherein the fourth switch is closed during the sample phase; and
   a fifth switch that is coupled between the second capacitor and the output terminal of the reference amplifier, wherein the second switch is closed during the hold phase.

3. The apparatus of claim 2, wherein the input signal is a differential input signal, and wherein the first capacitor receives one of negative and positive portions of the differential input signal.

4. The apparatus of claim 3, wherein the switched capacitor amplifier circuit further comprises:
   a sixth switch that receives the negative portion of the differential input signal and that is closed during the sample phase;
   a seventh switch that receives the positive portion of the differential input signal and that is closed during the sample phase;
   an eighth switch that receives the first reference voltage and that is closed during the hold phase;
   a ninth switch that receives the first reference voltage and that is closed during the hold phase;
   a third capacitor that is coupled to the sixth and eighth switches;
   a fourth capacitor that is coupled to the seventh and ninth switches;
   a differential amplifier having a first input terminal, a second input terminal, and an output terminal, wherein the first input terminal of the differential amplifier is coupled to the third capacitor, and wherein the first input terminal of the differential amplifier is coupled to the fourth capacitor;
   a tenth switch that receives the first input common mode voltage, that is coupled to the first input terminal of the differential amplifier, and that is closed during the sample phase;
   an eleventh switch that receives the first input common mode voltage, that is coupled to the second input terminal of the differential amplifier, and that is closed during the sample phase;
   a fifth capacitor that is coupled to the second input terminal of the differential amplifier;
   a twelfth switch that is coupled to the fifth capacitor and that is closed during the sample phase; and
   a thirteenth switch that is coupled between the fifth capacitor and the output terminal of the differential amplifier, wherein the thirteenth switch is closed during the hold phase.

5. An apparatus comprising:
   an image capture circuit;
   an switched capacitor differential amplifier circuit having:
      a switched capacitor amplifier circuit that samples a differential input signal from the image capture circuit during a sample phase, that receives a first reference voltage during a hold phase, that receives a first input common mode voltage during the sample phase voltage, and that receive an output common mode voltage during the sample phase; and
      a reference signal generator having:
         an reference amplifier having a first input terminal, a second input terminal, and an output terminal, wherein the first input terminal of the reference amplifier receives a second input common mode voltage, and wherein the output terminal of the reference amplifier is coupled to the switched capacitor reference amplifier circuit so as to provide the first reference voltage to the switched capacitor reference amplifier circuit during the hold phase; and
         a switched capacitor network having a plurality of switches and a plurality of capacitors, wherein the switched capacitor network is coupled to the second input terminal of the reference amplifier and the output terminal of the reference amplifier, wherein at least one of the capacitors receives at least one of negative and positive portions of the input signal during the sample phase and a second reference voltage during the hold phase, and wherein at least one of the capacitors receives the output common mode voltage during the sample phase and the second input common mode voltage during the sample phase;
   a correlated double sampling (CDS) amplifier that is coupled to the switched capacitor amplifier circuit;

an analog-to-digital converter (ADC) that is coupled to the CDS amplifier; and an a processor that is coupled to the ADC.

6. The apparatus of claim 5, wherein the switched capacitor network further comprises:
- a first switch that receives at least one of the negative and positive portions of the input signal, wherein the first switch is closed during a sample phase;
- a second switch that receives the second reference voltage, wherein the second switch is closed during a hold phase;
- a first capacitor that is coupled to the first switch, the second switch, and the second input terminal of the reference amplifier;
- a third switch that is coupled to the second input terminal of the second capacitor and that receives the second input common mode voltage, wherein the third switch is closed during the sample phase;
- a second capacitor that is coupled to the second input terminal of the reference amplifier;
- a fourth switch that receives the output common mode voltage and that is coupled to the reference amplifier, wherein the fourth switch is closed during the sample phase; and
- a fifth switch that is coupled between the second capacitor and the output terminal of the reference amplifier, wherein the second switch is closed during the hold phase.

7. The apparatus of claim 6, wherein the switched capacitor amplifier circuit further comprises:
- a sixth switch that receives the negative portion of the differential input signal and that is closed during the sample phase;
- a seventh switch that receives the positive portion of the differential input signal and that is closed during the sample phase;
- an eighth switch that receives the first reference voltage and that is closed during the hold phase;
- a ninth switch that receives the first reference voltage and that is closed during the hold phase;
- a third capacitor that is coupled to the sixth and eighth switches;
- a fourth capacitor that is coupled to the seventh and ninth switches;
- a differential amplifier having a first input terminal, a second input terminal, and an output terminal, wherein the first input terminal of the differential amplifier is coupled to the third capacitor, and wherein the first input terminal of the differential amplifier is coupled to the fourth capacitor;
- a tenth switch that receives the first input common mode voltage, that is coupled to the first input terminal of the differential amplifier, and that is closed during the sample phase;
- an eleventh switch that receives the first input common mode voltage, that is coupled to the second input terminal of the differential amplifier, and that is closed during the sample phase;
- a fifth capacitor that is coupled to the second input terminal of the differential amplifier;
- a twelfth switch that is coupled to the fifth capacitor and that is closed during the sample phase; and
- a thirteenth switch that is coupled between the fifth capacitor and the output terminal of the differential amplifier, wherein the thirteenth switch is closed during the hold phase.

8. The apparatus of claim 7, wherein the an image capture circuit further comprises a sensor.

* * * * *